US010143117B2

(12) United States Patent
Lin (10) Patent No.: US 10,143,117 B2
(45) Date of Patent: Nov. 27, 2018

(54) HIGH POWER DENSITY DC-AC POWER INVERTER

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

(*) Notice: Subject to any disclaimer, the term of this patent is extended or adjusted under 35 U.S.C. 154(b) by 0 days.

(21) Appl. No.: 15/480,706

(22) Filed: Apr. 6, 2017

(65) Prior Publication Data
US 2018/0295755 A1    Oct. 11, 2018

(51) Int. Cl.
| H05K 7/20 | (2006.01) |
| H05K 7/14 | (2006.01) |
| H01L 23/467 | (2006.01) |
| H02M 7/44 | (2006.01) |

(52) U.S. Cl.
CPC .......... H05K 7/20909 (2013.01); H02M 7/44 (2013.01); H05K 7/1432 (2013.01); H05K 7/209 (2013.01); H05K 7/20145 (2013.01); H01L 23/467 (2013.01); H05K 7/20918 (2013.01)

(58) Field of Classification Search
CPC ........................ H05K 7/2089–7/20918; H05K 7/20136–7/20163; H01L 23/46–23/467
USPC ......... 361/695; 165/80.1–80.2; 257/721–722
See application file for complete search history.

(56) References Cited

U.S. PATENT DOCUMENTS

| 5,091,823 | A | * | 2/1992 | Kanbara | ................. | H02M 5/44 174/351 |
| 6,914,779 | B2 | * | 7/2005 | Askeland | ................. | G06F 1/182 257/E23.099 |
| 8,767,401 | B2 | * | 7/2014 | Kim | ................... | H05K 7/20909 361/697 |
| 8,837,119 | B2 | * | 9/2014 | Kishimoto | ............ | H02M 5/271 307/126 |
| 9,192,079 | B2 | * | 11/2015 | Loth | .................. | H05K 7/20918 |
| 2003/0039881 | A1 | * | 2/2003 | Mount | ................ | H01M 2/1077 429/100 |
| 2013/0099493 | A1 | * | 4/2013 | Taniguchi | ............... | H02P 27/08 290/31 |
| 2018/0158748 | A1 | * | 6/2018 | Kwon | ................. | H01L 23/3675 |

* cited by examiner

*Primary Examiner* — Zachary Pape
(74) *Attorney, Agent, or Firm* — Ming Chow; Sinorica, LLC (57) ABSTRACT

A high power density DC-AC power inverter includes a casing corresponding to a rack. The casing has air inlets and air outlets arranged in a honeycomb shape and a fan unit. The casing is provided with two choke coils and a heat sink therein. The heat sink includes fins facing downward. A plurality of power elements are laterally provided on top of the heat sink. The heat generated from the power elements can be conducted to the fins of the heat sink quickly. The fan unit guides the outside air to the heat sink and the choke coils through the air inlets, and the heat is smoothly expelled out of the casing through the air outlets of the casing. The power inverter in a high density configuration still has a good heat dissipation effect.

7 Claims, 7 Drawing Sheets

HIGH POWER DENSITY DC-AC POWER INVERTER

FIELD OF THE INVENTION

The present invention relates to the configuration of a power inverter, and more particularly to a high power density DC-AC power inverter.

BACKGROUND OF THE INVENTION

Various power inverters have been widely used in electronic circuits (such as power supplies, computers, household appliances, nuclear magnetic resonance gradient amplifiers, UPS uninterruptible power systems, solar inverters, converters, power amplifiers for a vibration test, frequency converter of 400 Hz, 800 Hz, 1200 Hz, etc.) to provide a stable constant voltage or constant current. Its function is that an input power type is converted into a required load power type. In general, a power inverter is composed of a power switch component (such as a power transistor, a power diode, etc.), an electrical energy storage, and a filter component (such as an inductor, a capacitor, a transformer, a choke coil, etc.), and a detection and control component.

Thereby, the voltage or current is adjusted (switched and rectified) by the detection and control component to control the power switch component. The electric energy storage and the filter component provide the required filtering and temporary electrical energy for converting the electric energy. However, during the power conversion, the power inverter converts part of the energy supplied from the power supply into heat energy. The heat energy is concentrated in the power transistor and the choke coil of the power inverter.

The demand for power inverters used for industrial and server applications is extremely large. The power inverters are mounted to a chassis through a rack. A general business gathers power inverters and servers in a computer room to facilitate the management. The power inverters and the servers are running all day long. Therefore, the heat dissipation of the power inverters is particularly important.

For the convenience of management and space saving, the casing for the rack-type power inverter usually adopts a common industrial standard, its width is fixed at 19 inches, height in U units (1 U=1.75 inches=44.45 mm). The standard casings are usually 1 U, 2 U, 3 U, and others. In general, at the same power, the power inverter composed of a power switch component, a power storage, and a filter component, and a detection and control component needs better heat dissipation conditions, so it is necessary to use a larger casing, such as a casing of 3 U or more.

However, in order to reduce the size of the casing, a casing of 2 U or less is developed accordingly. But its configuration design causes poor heat dissipation. The reason is that the power inverter has a plurality of choke coils and a plurality of power transistors. The choke coils are often horizontally arranged in the limited space, so the heat is concentrated at the bottoms of the choke coils. The power transistors and other electronic components are generally vertically arranged on the circuit board, which shields the wind blowing of the fan and cannot provide a smooth heat dissipation path. As a result, the heat is concentrated at the power transistors and the choke coils of the power inverter. The power inverter may stop running or fail or be damaged due to overheating.

Accordingly, the inventor of the present invention has devoted himself based on his many years of practical experiences to solve these problems.

SUMMARY OF THE INVENTION

The primary object of the present invention is to provide a high power density DC-AC power inverter. The heat generated from power elements and choke coils inside the power inverter can be conducted to the outside through a fan unit, achieving rapid heat dissipation.

In order to achieve the aforesaid object, the high power density DC-AC power inverter of the present invention is mounted to a rack. The high power density DC-AC power inverter comprises a casing, a fan unit, a heat sink, a plurality of power elements, and a circuit board module. The casing corresponds in size to the rack. A front side of the casing is formed with a plurality of air inlets. A rear side of the casing is formed with a plurality of air outlets. The fan unit is disposed at one side of the casing for guiding air to enter the casing via the air inlets and discharge to the outside via the air outlets in a guide direction. The heat sink is laterally disposed in the casing. The heat sink includes a plurality of spaced fins. The fins each have a long side parallel to the guide direction. The power elements each have a heat dissipation surface. The heat dissipation surfaces of the power elements are laterally attached to the heat sink. The circuit board module is laterally disposed above the heat sink and electrically connected with the power elements.

When the power inverter is actuated, the power elements generate heat and the heat is conducted to the fins of the heat sink via the shortest route. The fan unit guides the outside cold air into the casing via the air inlets of the casing to pass through the fins of the heat sink for heat dissipation, and the heat is smoothly expelled out of the casing via the air outlets of the casing.

DETAILED DESCRIPTION OF THE PREFERRED EMBODIMENTS

Embodiments of the present invention will now be described, by way of example only, with reference to the accompanying drawings.

Figure 1:
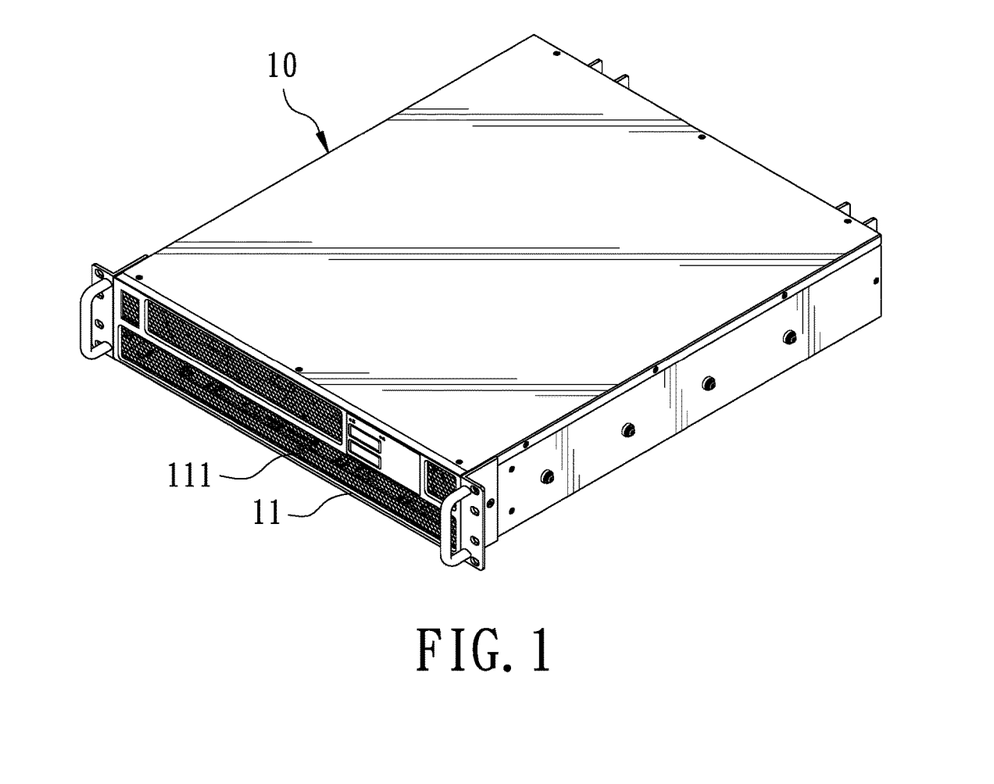
FIG. 1 is a perspective view in accordance with a preferred embodiment of the present invention.
Figure 2:
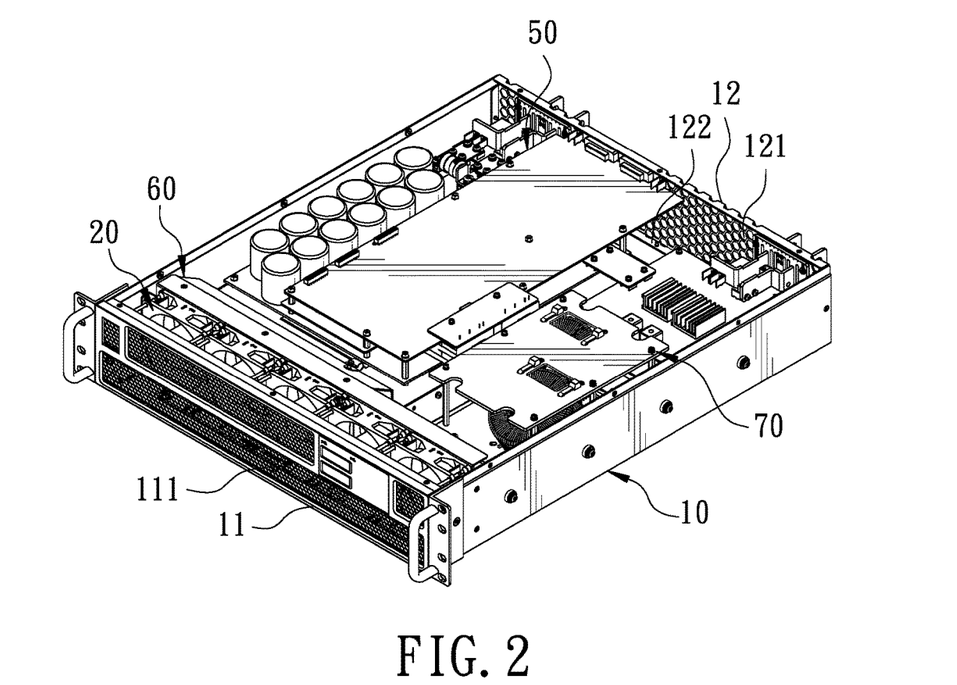
FIG. 2 is another perspective view in accordance with the preferred embodiment of the present invention.
Figure 3:
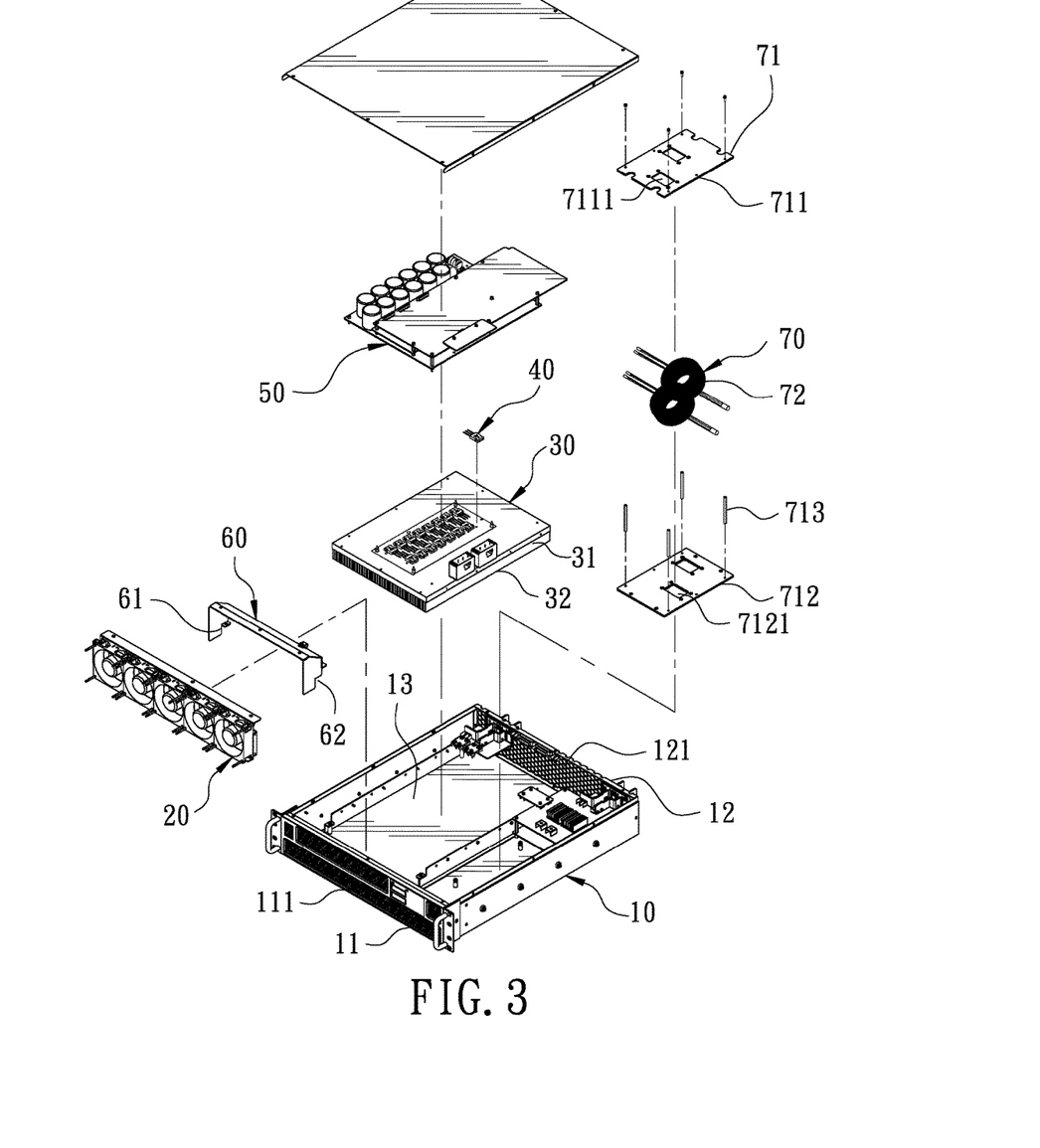
FIG. 3 is an exploded view in accordance with the preferred embodiment of the present invention.

FIG. 1, FIG. 2 and FIG. 3 illustrate perspective views and an exploded view of a high power density DC-AC power inverter in accordance with a preferred embodiment of the present invention. The power inverter may be mounted to a rack. The power inverter comprises a casing 10, a fan unit 20, a heat sink 30, a plurality of power elements 40, a circuit board module 50, a wind scooper 60, and a choke coil module 70.

The casing 10 corresponds in size to the rack. Front and rear sides of the casing 10 are provided with a front panel 11 and a rear panel 12, respectively. The bottom of the casing 10 is provided with a bottom plate 13. The front panel 11 is formed with a plurality of air inlets 111. The rear panel 12 is formed with a plurality of air outlets 121. The air inlets 111 and the air outlets 121 are arranged in a honeycomb shape. A lower edge of the rear panel 12 is bent inwardly to form a connecting portion 122. The connecting portion 122 is overlapped with the bottom plate 13 of the casing 10, so that a portion of the air outlets 121 is located at the junction of the rear panel 12 and the bottom plate 13 to reduce the accumulation of dust.

The fan unit 20 is disposed at one side of the casing 10. The fan unit 20 is disposed in the casing 10 close to the air inlets 111 for guiding the outside cold air to enter the casing 10 via the air inlets 111 and then discharge to the outside via the air outlets 121, so that the air inlets 111 and the air outlets 121 form a guide direction for heat dissipation.

The heat sink 30 is made of a heat-dissipating aluminum material, and is disposed in the casing 10. The heat sink 30 is located adjacent to the air inlets 111. The heat sink 30 includes a plurality of spaced fins 31. The fins 31 face downward. The fins 31 each have a long side parallel to the guide direction.

Figure 4:
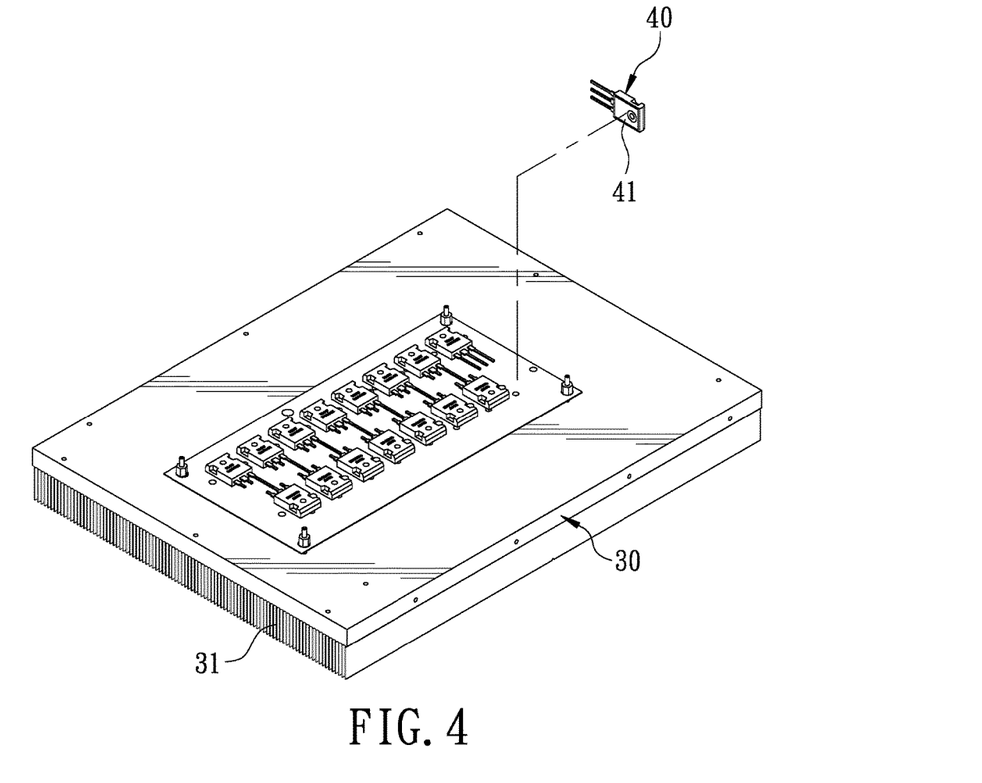
FIG. 4 is a perspective view of the present invention, showing the power elements and the heat sink.

Referring to FIG. 4, in this embodiment, the power elements 40 are metal oxide semiconductor field effect transistors (MOSFETs). The power elements 40 are located on top of the heat sink 30. Each power element 40 has a heat dissipation surface 41 which is laterally attached to a top surface of the heat sink 30, so that the heat generated from the power element 40 can be quickly conducted to the fins 31 of the heat sink 30.

Figure 5:
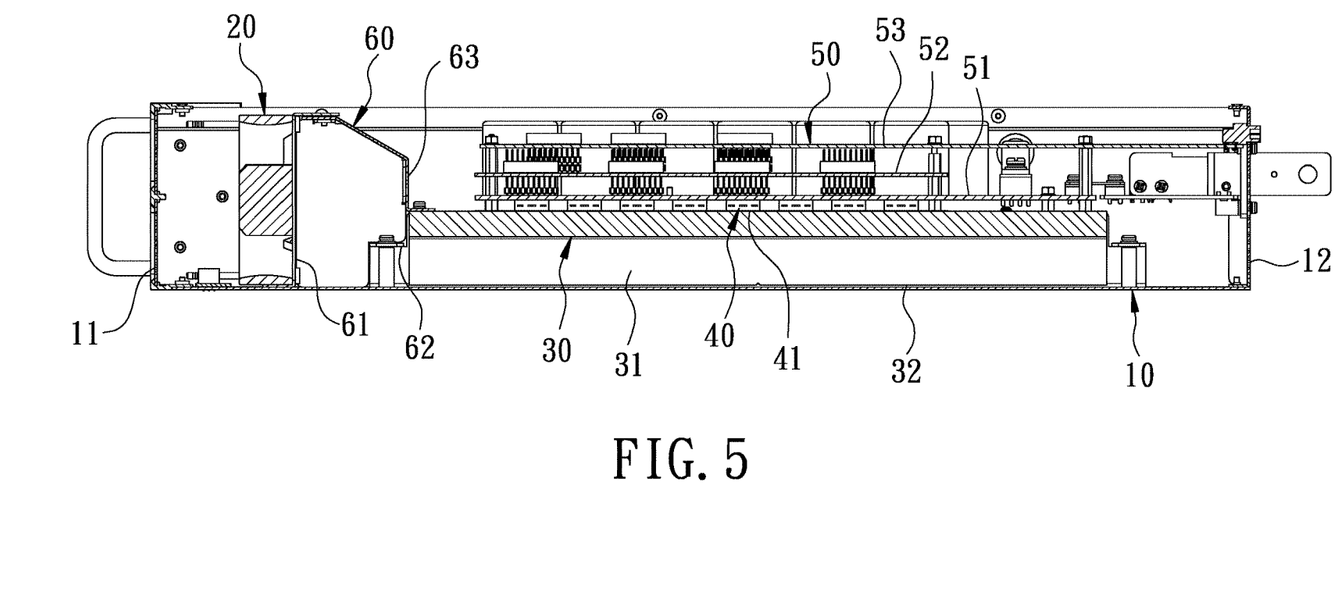
FIG. 5 is a sectional view of the present invention, showing the structure of the circuit board module in the casing.

The circuit board module 50, as shown in FIG. 5, is laterally disposed above the heat sink 30 and is electrically connected with the power elements 40. The circuit board module 50 includes a power element circuit board 51, a drive board 52, and a control board 53. The power element circuit board 51, the drive board 52 and the control board 53 are superposed from each other from bottom to top, and are electrically connected through longitudinal slots to form the shortest distance so as to reduce the noise and ringing effect.

Figure 6:
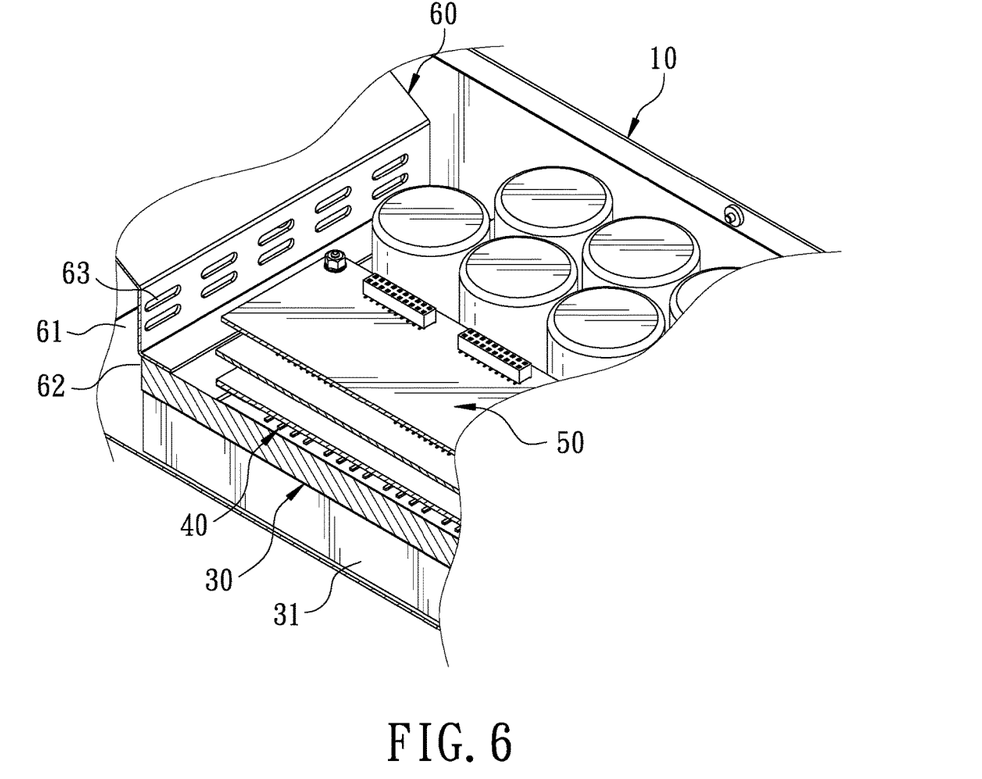
FIG. 6 is a partial perspective view of the present invention, showing the structure of the wind scooper in the casing.

The wind scooper 60, referring to FIG. 6, is disposed in the casing 10. The wind scooper 60 is located between the fan unit 20 and the heat sink 30. The wind scooper 60 has a guide entrance 61 adjacent to the fan unit 20 and a guide exit 62 adjacent to the heat sink 30 for guiding the outside air from the air inlets 11 to the fins 31 of the heat sink 30. The wind scooper 60 is further provided with a plurality of guide holes 63. The guide holes 63 are located above the heat sink 30 and adjacent to the power elements 40. The guide entrance 61 of the wind scooper 60 is greater than the guide exit 62 and the guide holes 63, and the guide exit 62 is greater than the guide holes 63.

Figure 7:
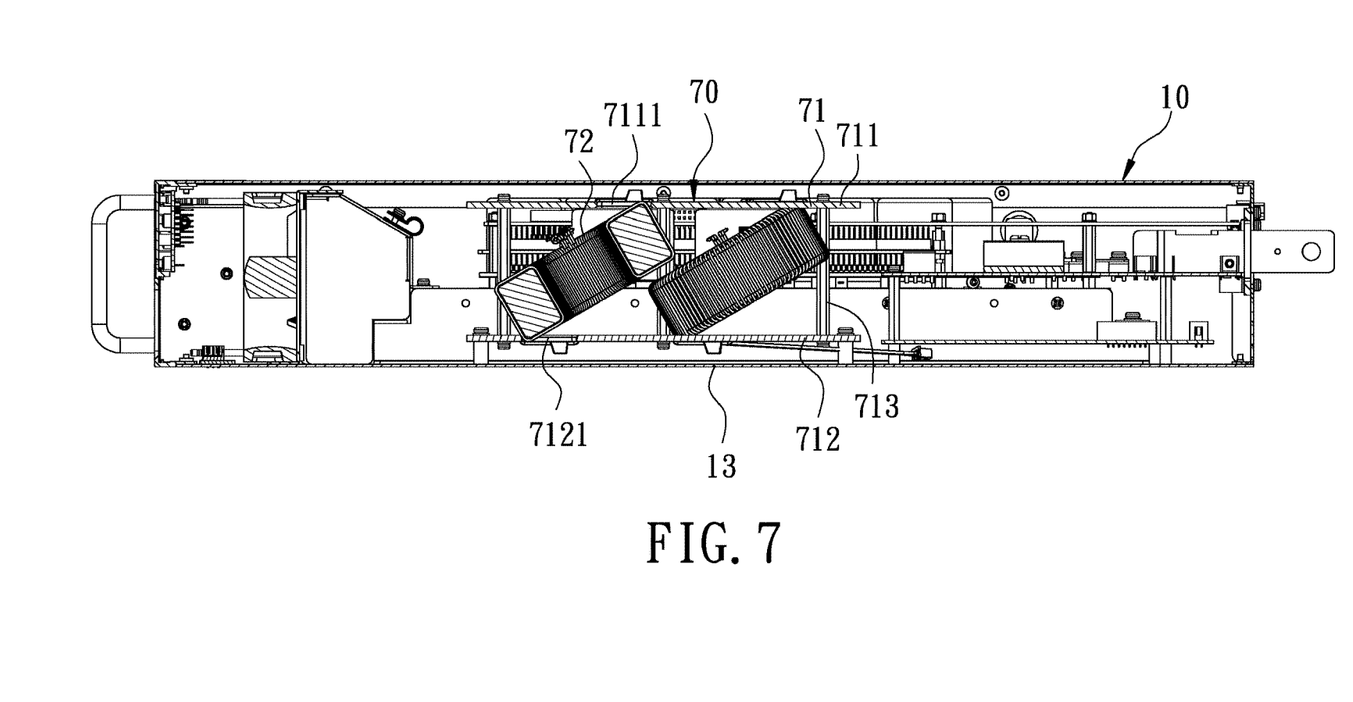
FIG. 7 is a sectional view of the present invention, showing the structure of the choke coil module mounted in the casing.

The choke coil module 70, referring to FIG. 7, is disposed in the casing 10. The choke coil module 70 includes a retainer 71. The retainer 71 includes an upper plate 711 and a lower plate 712 which are laterally disposed. The lower plate 712 is fixed to the bottom plate 13 of the casing 10. The upper plate 711 is located above the lower plate 712, and is fixedly connected to the lower plate 712 through a plurality of longitudinal locking rods 713, so that the retainer 71 is formed with an accommodation space between the upper plate 711 and the lower plate 712. The upper plate 711 and the lower plate 712 have two slots 7111, 7121, respectively. The choke coil module 70 includes two choke coils 72 in the accommodation space of the retainer 71. The choke coils 72 are disposed in the accommodation space of the retainer 71 in a staggered manner and slant from bottom to top toward the rear side of the casing 10. Top portions and bottom portions of the choke coils 72 protrude out of and lean against the slots 7111, 7121 of the upper plate 711 and the lower plate 712, respectively.

Referring to FIG. 5 and FIG. 7, when the power inverter is actuated, the power elements 40 and the choke coil module 70 generate heat and the heat is conducted to the fins 31 of the heat sink 30. In addition, the choke coils 72 generate heat and the heat is conducted to the surroundings of the choke coils 72. Meanwhile, the fan unit 20 guides the outside cold air to enter the casing 10 via the air inlets 111 of the casing 10. Through the guide entrance 62 and the guide exit 63 of the wind scooper 60, the outside cold air is guided to the fins 31 of the heat sink 30 and the choke coils 72 for heat dissipation, and the heat is expelled out of the casing 10 via the air outlets 121 of the casing 10 to achieve rapid heat dissipation.

Referring to FIG. 4 and FIG. 5, the heat dissipation surfaces 41 of the power elements 40 are laterally attached to the heat sink 30. When the power elements 40 generate heat, the heat can be easily conducted through the respective heat dissipation surfaces 41 to the heat sink 30. The fins 31 are spaced apart from each other, and the fins 31 each have a long side. The long sides of the fins 31 are parallel to the guide direction, and a guide passage is defined between every two of the fins 31. The wind generated by the fan unit 20 can easily pass through the fins 31 for heat dissipation without blocking the route of wind blowing.

Referring to FIG. 6, the guide entrance 61 of the wind scooper 60 is greater than the guide exit 62 and the guide holes 63, and the guide exit 62 is greater than the guide holes 63 for controlling the air blown by the wind. The majority of the wind is concentrated at the guide exit 62 of the wind scooper 60 for the heat dissipation of the fins 31 of the heat sink 30. The guide exit 63 of the wind scooper 60 is above the heat sink 30 so that a small portion of the wind can be blown to the circuit board module 50 above the heat sink 30 for heat dissipation.

Referring to FIG. 7, the slots 7111, 7121 of the choke coil module 70 are adapted to engage with the top portions and the bottom portions of the choke coils 72 so that the choke coils 72 are secured stably. Through the slots 7111, 7121, the choke coils 20 can be easily arranged obliquely from bottom to top. The choke coils 72 slant from bottom to top toward the air outlets 121. The wind blown by the fan unit 20 passes through the slots 7111 of the upper plate 711 to radiate the heat at the bottoms of the choke coils 72, such that the heat won't be accumulated at the bottoms of the choke coils 72 and the power inverter won't fail due to overheating.

It is to be noted that only the front panel 11 and the rear panel 12 of the casing 10 are formed with the air inlets 111 and the air outlets 121. There is no need for the upper and lower sides as well as left and right sides of the casing 10 to be formed with vents, so the casing 10 is more suitable to be mounted to the rack.

The features and expected effects of the present invention are described below.

The fan unit 20, the heat sink 30, the power elements 40, the circuit board module 50, and the choke coil module 70 in the casing 10 are suitably configured. When the power inverter is actuated, the heat generated from the power elements 40 can be conducted to the fins 31 of the heat sink 30 via the shortest route. Through the fan unit 20, the outside air is guided through the air inlets 111 of the casing 10 to enter the casing 10, so that the heat from the heat sink 30 and the choke coils 72 is discharged to the outside through the air outlets 121 of the casing 10 to achieve rapid heat dissipation. The present invention can be used in a smaller casing with a 2 U height to provide excellent heat dissipation. That is, in the same casing, the present invention is able to output greater power, compared to the traditional power inverter.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A high power density DC-AC power inverter, mounted to a rack, the high power density DC-AC power inverter comprising: a casing, corresponding in size to the rack and having a rectangular shape, a front side of the casing being formed with a plurality of air inlets, a rear side of the casing being formed with a plurality of air outlets, a bottom of the casing being provided with a bottom plate; a fan unit, disposed at one side of the casing, for guiding outside cold air to enter the casing via the air inlets and discharge to the outside via the air outlets in a guide direction; a heat sink, disposed in the casing, the heat sink including a plurality of spaced fins, the fins each having a long side parallel to the guide direction; a plurality of power elements, each having a heat dissipation surface, the heat dissipation surfaces of the power elements being laterally attached to the heat sink; a circuit board module, laterally disposed above the heat sink and electrically connected with the power elements; when the power inverter is actuated, the power elements generate heat and the heat is conducted to the fins of the heat sink via a shortest route, the fan unit guides the outside cold air into the casing via the air inlets of the casing to pass through the fins of the heat sink for heat dissipation, and the heat is expelled out of the casing via the air outlets of the casing; a wind scooper disposed in the casing, the wind scooper being located between the fan unit and the heat sink, the wind scooper having a guide entrance adjacent to the fan unit and a guide exit adjacent to the heat sink for guiding the outside air from the air inlets to the fins of the heat sink, the wind scooper further having a plurality of guide holes adjacent to the power elements, the guide holes being located above the heat sink, the guide entrance of the wind scooper being greater than the guide exit and the guide holes, the guide exit being greater than the guide holes; and a choke coil module disposed in the casing, the choke coil module including a retainer, the retainer including an upper plate and a lower plate which are laterally disposed, the lower plate being fixed to a bottom of the casing.

2. The high power density DC-AC power inverter as claimed in claim 1, wherein the upper plate being located above the lower plate and fixedly connected to the lower plate through a plurality of longitudinal locking rods so that the retainer is formed with an accommodation space between the upper plate and the lower plate, the upper plate and the lower plate each having two slots, the choke coil module including two choke coils in the accommodation space of the retainer, the choke coils being disposed in the accommodation space of the retainer in a staggered manner and slanting from bottom to top toward the rear side of the casing, top portions and bottom portions of the choke coils protruding out of and leaning against the slots of the upper plate and the lower plate, respectively.

3. The high power density DC-AC power inverter as claimed in claim 1, wherein the circuit board module includes a power element circuit board, a drive board, and a control board, wherein the power element circuit board, the drive board and the control board are superposed from bottom to top and spaced from each other to form a gap and are electrically connected.

4. The high power density DC-AC power inverter as claimed in claim 1, wherein the rear side of the casing is provided with a rear panel, the rear panel is formed with the air outlets, wherein a lower edge of the rear panel is bent inwardly to form a connecting portion, and the connecting portion is overlapped with the bottom plate of the casing so that a portion of the air outlets is located at the junction of the rear panel and the bottom plate.

5. The high power density DC-AC power inverter as claimed in claim 1, wherein the air inlets and the air outlets are arranged in a honeycomb shape.

6. The high power density DC-AC power inverter as claimed in claim 1, wherein the fan unit is disposed in the casing close to the air inlets.

7. The high power density DC-AC power inverter as claimed in claim 1, wherein the power elements are metal oxide semiconductor field effect transistors.

* * * * *